United States Patent
Hu et al.

(10) Patent No.: US 6,204,173 B1
(45) Date of Patent: *Mar. 20, 2001

(54) MULTIPLE IMPLANTATION AND GRAIN GROWTH METHOD

(75) Inventors: Yong-Jun Hu; Pai Hung Pan, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/209,325

(22) Filed: Dec. 11, 1998

Related U.S. Application Data

(60) Continuation of application No. 08/663,551, filed on Jun. 13, 1996, now Pat. No. 5,874,351, which is a division of application No. 09/098,810, filed on Jun. 17, 1998, now Pat. No. 6,054,744.

(51) Int. Cl.[7] ............... H01L 21/425; H01L 21/3205; H01L 21/44

(52) U.S. Cl. ............... 438/659; 438/527; 438/533; 438/592; 438/655; 438/660; 438/683

(58) Field of Search ............... 438/527, 655, 438/659, 663, 532, 533, 592, 660, 664, 683, 353, 360, 158

(56) References Cited

U.S. PATENT DOCUMENTS

| | | | |
|---|---|---|---|
| 4,788,160 | 11/1988 | Havemann et al. | 438/533 |
| 4,912,542 | 3/1990 | Suguro | 257/755 |
| 5,034,791 | * 7/1991 | Kameyama et al. | 357/23.9 |
| 5,210,043 | 5/1993 | Hosaka | 438/533 |
| 5,393,687 | 2/1995 | Liang | 438/532 |
| 5,395,797 | 3/1995 | Lee et al. | 438/527 |
| 5,468,974 | 11/1995 | Aronowitz et al. | 438/532 |
| 5,541,131 | 7/1996 | Yoo et al. | 438/592 |
| 5,624,869 | 4/1997 | Agnello et al. | 438/659 |
| 5,633,200 | 5/1997 | Hu | 438/653 |
| 5,656,546 | 8/1997 | Chen et al. | 438/586 |
| 5,665,646 | 9/1997 | Kitano | 438/664 |
| 5,739,064 | 4/1998 | Hu et al. | 438/528 |

FOREIGN PATENT DOCUMENTS

| | | |
|---|---|---|
| 63-175420 | 7/1988 | (JP) . |
| 63-181422 | 7/1988 | (JP) . |

OTHER PUBLICATIONS

"Crystallization of Amorphous Ti–Si Alloy Thin Film Microstructure and Resistivity," J. Apl. Phys., vol. 65, No. 10 (1989) by I.J.M.M. Raaijmakers et al., p. 3896–3906.

"Titanium Silicides and Their Technological Applications," by L.A. Clevenger and R.W. Mann, Mat. Res. Soc. Symp. Proc., vol. 320, pp. 15–25.

\* cited by examiner

*Primary Examiner*—John F. Niebling
*Assistant Examiner*—Ha Tran Nguyen
(74) *Attorney, Agent, or Firm*—Workman, Nydegger & Seeley

(57) ABSTRACT

A method of controlling stresses in thin films that are deposited over semiconductor device substrates. During anneal process steps, grain growth of the film creates stresses in that can damage or destroy it. The stresses lead to warping and bowing and ultimately to film cracking which undermines desired low resistivity. The present invention imparts thermal stability to thin films by grain boundary stuffing (GBS) of preselected elements that resist film grain changes that cause the stresses. GBS implants the elements into the thin film at desired depths, but above the film-substrate interface, sufficient to prevent or lessen destructive grain growth. GBS provides for structural film stability required during severe thermal cycles that occur during subsequent processing of semiconductor devices.

30 Claims, 3 Drawing Sheets

MULTIPLE IMPLANTATION AND GRAIN GROWTH METHOD

1. RELATED APPLICATIONS

This is a continuation application of U.S. patent application Ser. No. 08/663,551 now U.S. Pat. No. 5,874,351, filed on Jun. 13, 1996, titled "Sputtered Metal Silicide Film Stress Control by Grain Boundary Stuffing", from which a divisional patent application was filed which is U.S. patent application Ser. No. 09/098,810 now U.S. Pat. No. 6,054,744 was filed on Jun. 17, 1998, titled "Metal Silicide Film Stress Control by Grain Boundary Stuffing", each of foregoing being incorporated herein by reference.

BACKGROUND OF THE INVENTION

2. The Field of the Invention

The present invention relates the manufacture of semiconductor devices. More particularly, the present invention relates to a semiconductor wafer having semiconductor devices thereon, the semiconductor wafer having a substrate with a thin film thereon that is treated to prevent destructive stresses in the thin film, and a method of manufacture thereof.

3. The Relevant Technology

A layer of a material that is typically used in semiconductor device formation is a $TiSi_x$ film which is layered upon a semiconductor wafer. $TiSi_x$ films, when so used, are typically subjected to high temperature annealing cycles. During anneal process steps, grain growth of the films creates stresses that can damage or destroy the thin film. The stresses lead to warping and bowing and ultimately to film cracking which undermines desired low resistivity. The high temperature annealing cycles cause $TiSi_x$ films to experience low thermal stability. Additionally, problems are encountered with high overall sheet resistivity, and the variance thereof, of the $TiSi_x$ films. These problems all contribute to the problem of warping or bowing of semiconductor wafers associated with the use of $TiSi_x$ films used in the fabrication of semiconductor devices.

As seen in FIG. 1, a semiconductor wafer 10 has a substrate 12 with a layer of material 14 deposited thereover. After one or more heat treatments of semiconductor wafer 10, layer of material 14 incurs physical stress sufficient to induce a warpage in semiconductor wafer 10 as seen in FIG. 2. By way of example, layer of material 14 can be a metal silicide layer, such as a $TiSi_x$ film, which is composed of a plurality of grains 16 as is depicted in FIG. 3.

As it is known in the art that high-temperature annealing is required to achieve the minimum possible room-temperature resistivity of any given silicide, it is clear that advances are needed which will better control the mechanical and electrical stability of $TiSi_2$ films during high temperature silicide formation and annealing.

Polycrystalline silicon (polysilicon) is the preferred material for gate electrodes in MOSFET structures. Polysilicon is advantageous over metal gate electrodes as it can withstand much higher subsequent processing temperatures before eutectic temperatures are reached. Polysilicon is readily deposited on bulk silicon or $SiO_2$ using low pressure chemical vapor deposition (LPCVD).

As the drive toward integrating more active devices on a single integrated circuit necessitates the fabrication of increasingly small MOSFET structures, the resistance of the MOSFET gate becomes a limiting factor in device speed. As such, it is beneficial to use materials with the lowest possible sheet resistivities for making contact with the polysilicon gate structure. To this end, it is well known that refractory metal silicides call be readily formed on polysilicon MOSFET gate structures using conventional deposition techniques. The refractory metal silicides have low sheet resistivities after annealing and also form low resistance ohmic contacts with commonly used interconnect metals. The resistance of the silicide/polysilicon interface and its overall integrity are greatly affected by the manner in which the structures are processed.

Of all the available silicides, titanium silicide ($TiSi_2$) has the lowest sheet resistivity when it has been annealed to its C54 crystalline phase. To obtain the desired low resistance requires high temperature annealing in the range of about 500 to about 1100° C. Numerous techniques for creating and annealing $TiSi_2$ films on MOSFET source and drain electrodes are known, which techniques can be used in the present inventive method so as to obtain the desired low sheet resistivities. The most common of these techniques involve depositing, such as by sputtering, either pure titanium metal, or co-depositing stoichiometric titanium silicide ($TiSi_x$), with subsequent annealing steps to convert the layer to $TiSi_2$ in the C54 crystalline phase.

Typically, a thin film of titanium silicide is sputtered onto a substrate in preparation for making a semiconductor device. The sputtered layer is then annealed, for example in rapid thermal processing (RTP), at 1000° C. for a period of about 20 seconds, and in an $N_2$ environment. This anneal can be conducted as many as three times where the device is subjected to further RTP steps as the integrated circuit advances through the fabrication process to completion. Such high thermal cycles cause stress in a silicide-substrate interface due to dynamic grain morphology that results in warping and bowing of the structure. Warping and bowing lead to imperfect surfaces, which make it difficult to conduct photolithography and other processes. Such difficulties ultimately reduce yield in the fabrication process. More particular to the present invention, warping and bowing lead ultimately to cracks forming in the thin film and the resistivity of the film is increased because of discontinuous contact throughout the thin film.

Warping and bowing of titanium disilicide thin films is specifically caused by collapse of the grain structure that existed from the PVD sputtering and as a result, long grains form that set up the ultimately destructive stresses. Because poor thermal stability of thin films leads to a higher resistivity in a damaged film, the device is ultimately slower or it can even malfunction.

The use of $TiSi_2$ in silicon gate MOSFET fabrication is becoming limited by insufficient process stability at the desired processing temperatures. This creates a problem as the trend toward increasingly complex integrated circuits necessitates an increasing number of high temperature processing steps after the deposition and formation of the silicide layer. Two specific unwanted side effects of the high temperature instability of $TiSi_2$ are of interest in the present invention and are explained briefly below.

The first unwanted side effect results from stresses induced in the silicide film. Co-deposited $TiSi_x$ films contain numerous structural point defects, such as grain boundaries and dislocations. As the silicon wafer is subjected to temperatures in the range of about 500 to about 1,100° C. in order to anneal the $TiSi_2$ the grain structure of the $TiSi_2$ changes from small to larger grains. If this stress becomes too large, cracks are induced in the $TiSi_2$ films causing increased and uneven resistivity across the $TiSi_2$ film. This results not only in slower MOSFET switching speeds but also in speeds which vary unacceptably from device to device on the same circuit die.

The second unwanted side effect also results from stresses induced in the $TiSi_2$ film. Stresses caused by improperly controlled $TiSi_2$ grain growth can result in warpage of the entire silicon wafer. In addition to the reliability concerns introduced by a warped wafer, warpage can contribute to lithographic alignment errors in subsequent patterning steps on fabrication lines that use projection patterning techniques. If a wafer surface becomes warped or wavy, the projected image will become distorted and cause improper image dimensions. This factor has becomes increasingly important as feature size decreases and wafer size increases. While wafer warpage can be limited by reducing the temperature ramp rates during high temperature long period annealing processes, this is usually not practical as semiconductor fabrication processes increasingly take advantage of the benefits of rapid thermal processing.

Accordingly, it would be an advance in the art to avoid the forgoing first and second unwanted side effect of stresses induced in a thin silicide film, and to reduce the mechanical semiconductor wafer stresses, develop superior sheet resistivity and thermal stability characteristics in $TiSi_x$ films, and thus induce less warping and bowing on the semiconductor wafer due to annealing of the semiconductor wafer at high temperatures.

SUMMARY OF THE INVENTION

The present invention describes a method of grain boundary stuffing (GBS) by implanting a thin film with ions of nitrogen, phosphorus and other preferred elements. The inventors have discovered that implantation of certain preferred elements in the thin film causes the film as sputtered to substantially retain its as-sputtered morphology. The as-sputtered structure resists warping, bowing, and ultimate film cracking, and also avoids increased resistivity and a slower device speed. Implantation also helps to limit or slow down large grain growth.

GBS, a selective depth ion implantation that creates a matrix within a thin film, has been developed to impart thermal stability to thin films in semiconductor device fabrication. More specifically, a series of improved processing steps are described for forming silicide films on amorphous, monocrystalline, or polycrystalline silicon as well as on silicon dioxide structures. These improved processing steps reduce the mechanical wafer stresses and interfacial failures due to grain collapse and subsequent long-grain growth of the substrates during high temperature annealing steps.

Processing steps which overcome the above-mentioned side effects of high temperature annealing are part of a semiconductor fabrication method which includes the following steps: (a) forming a field oxide film on a predetermined portion of a silicon substrate situated on a semiconductor wafer; (b) growing a gate oxide, depositing a polysilicon gate, and depositing a $TiSi_x$ layer on a predetermined portion of the substrate; (c) implanting the desired GBS matrix into $TiSi_x$ layer; (d) depositing an insulator(s) on $TiSi_x$ and then patterning them to form a(n) oxide/polysilicon/$TiSi_x$/insulator gate stack on a predetermined portion of the substrate while other portions of the substrate are left exposed; and (e) forming an insulating spacer along the sidewall of the gate stack.

By proper selection of the elements, concentrations, and implant depths of the above mentioned first and second diffusion barrier matrices, $TiSi_x$, polycide, and salicide structures can be created to have superior resistivity and thermal stability characteristics, thus inducing less warping and bowing on the semiconductor wafer.

BRIEF DESCRIPTION OF THE DRAWINGS

In order that the manner in which the above-recited and other advantages of the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Additional advantages of the present invention will become readily apparent to those skilled in this art from the following detailed description, wherein preferred embodiments of the invention are shown and described in the disclosure, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

Figure 1:
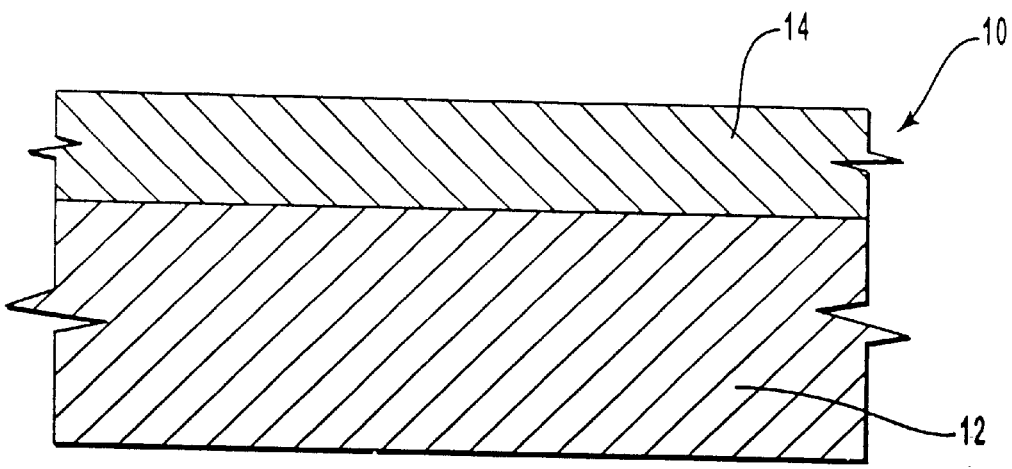
FIG. 1 is a cross-sectional depiction of a semiconductor wafer having a layer of material thereon.
Figure 2:
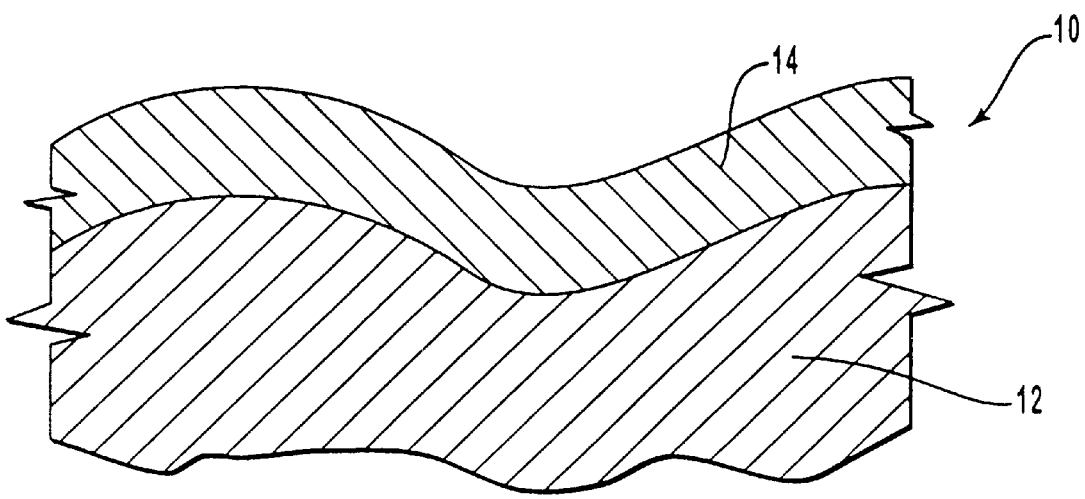
FIG. 2 is the structure seen in FIG. 1 after heat treatment causing the layer of material to incur physical stress sufficient to induce a warpage in the semiconductor wafer.
Figure 3:
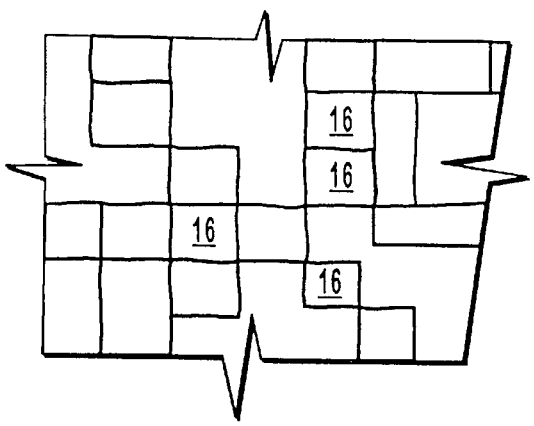
FIG. 3 is a simplified cross sectional magnified depiction of grains within a layer of material to be implanted with ions.
Figure 4:
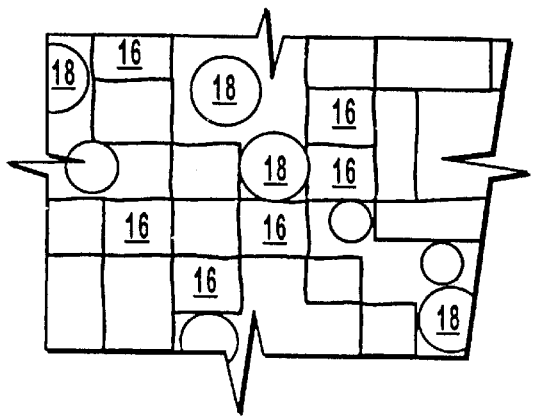
FIG. 4 is the layer of material depicted in FIG. 3 where ions have been implanted therein so as to be stuffed in between grain boundaries of the grains of the layer of material.
Figure 5:
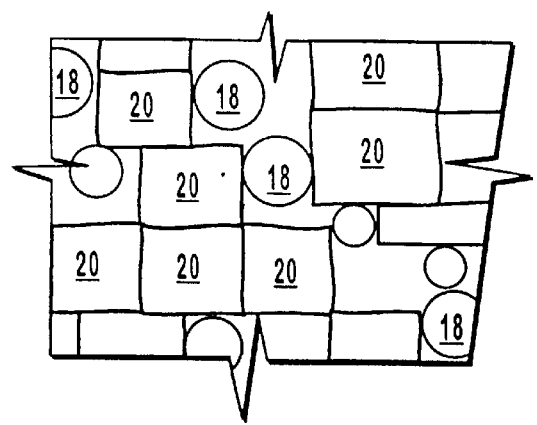
FIG. 5 is the layer of material depicted in FIG. 4 after heat treatment so as to increase the size of the grains of the layer of material.

An embodiment of the present invention is illustrated in FIGS. 3 though 5 in which the process of grain boundary stuffing (GBS) is depicted. In FIG. 3, a plurality of grains 16 of a thin film are seen in enlarged proportions. The thin film is implanted with a plurality of implanted dopant ions 18, as shown in FIG. 4. By way of example, implanted dopant ions 18 can be nitrogen, phosphorus, molybdenum, tungsten, cobalt, and other is preferred elements. Implanted dopants ions 18 fit in and around boundaries between grains 16 after the implanting process. As the semiconductor wafer upon which the thin film is situated is subjected to one or more heat treatments, grains 16 grow into larger size grains 20. The growth of grains 18 into larger size grains 20 cause a spatial rearrangement of implanted dopant ions 18 within grain boundaries of the thin film. As such, implanted dopant ions 18 are stuffed within the grain boundaries of larger size grains 20. As a result, stress is lower in the thin film after subsequent anneals as compared to the thin film without GBS.

GBS has been developed to impart thermal stability to the thin film in semiconductor device fabrication, but the technology can be used in any composite structure where brittle thin films are required to withstand severe thermal cycling. The thin film is first deposited upon a substrate such as $SiO_2$. Other substrates than $SiO_2$ are used in this invention, such as monocrystalline silicon, amorphous silicon (a-Si), and polycrystalline silicon (polysilicon). Other thin film layers are also contemplated, such as alumina, zirconia, ceria, and metal nitrides. More specifically, a series of improved processing steps are described for forming thermally stable thin silicide films on amorphous, monocrystalline or polycrystalline silicon, as well as on silicon dioxide substrates. These improved processing steps reduce the mechanical wafer stresses and interfacial failures due to grain collapse and subsequent long-grain growth of the films during high temperature annealing steps.

In some applications it is desirable to implant more than one species of ion in the thin film. This technique is employed where the substrate is composed of a material that tends to lower the melting point of a thin film by a catalytic effect. Implantation of a first matrix barrier of a preferred ion will effectively counteract the melting point-lowering effect of a given substrate, but the first matrix material itself acts as a melting point depressant and it too needs to be counteracted. Consequently, a second ion is implanted or stuffed into the grain boundaries of the thin film so as to either fully or partially overlap the first matrix, or so as to fully or partially be positioned above or below the first matrix.

In a specific application, four species of ions are implanted into a thin film. Tungsten, molybdenum, phosphorus, and nitrogen are implanted with the tungsten penetrating the deepest followed by molybdenum partially intersecting the tungsten matrix within the film, and the phosphorus and nitrogen follow the molybdenum matrix in like manner. Nitrogen, phosphorus, and other elements such as tungsten and molybdenum also reduce destructive stresses and thin film cracking during the high temperatures known to semiconductor device fabrication. Other subcombinations of these preferred species are implanted where the lightest of the group penetrates the deepest and then the heavier species are implanted with the same energy level, such that their penetration is shallower, inversely proportional to their mass in relation to the lightest species implanted. Because GBS increases resistivity, a lesser amount of each species is used, the total of which adds up to a mass about equivalent to when a single species is used.

Figure 6:
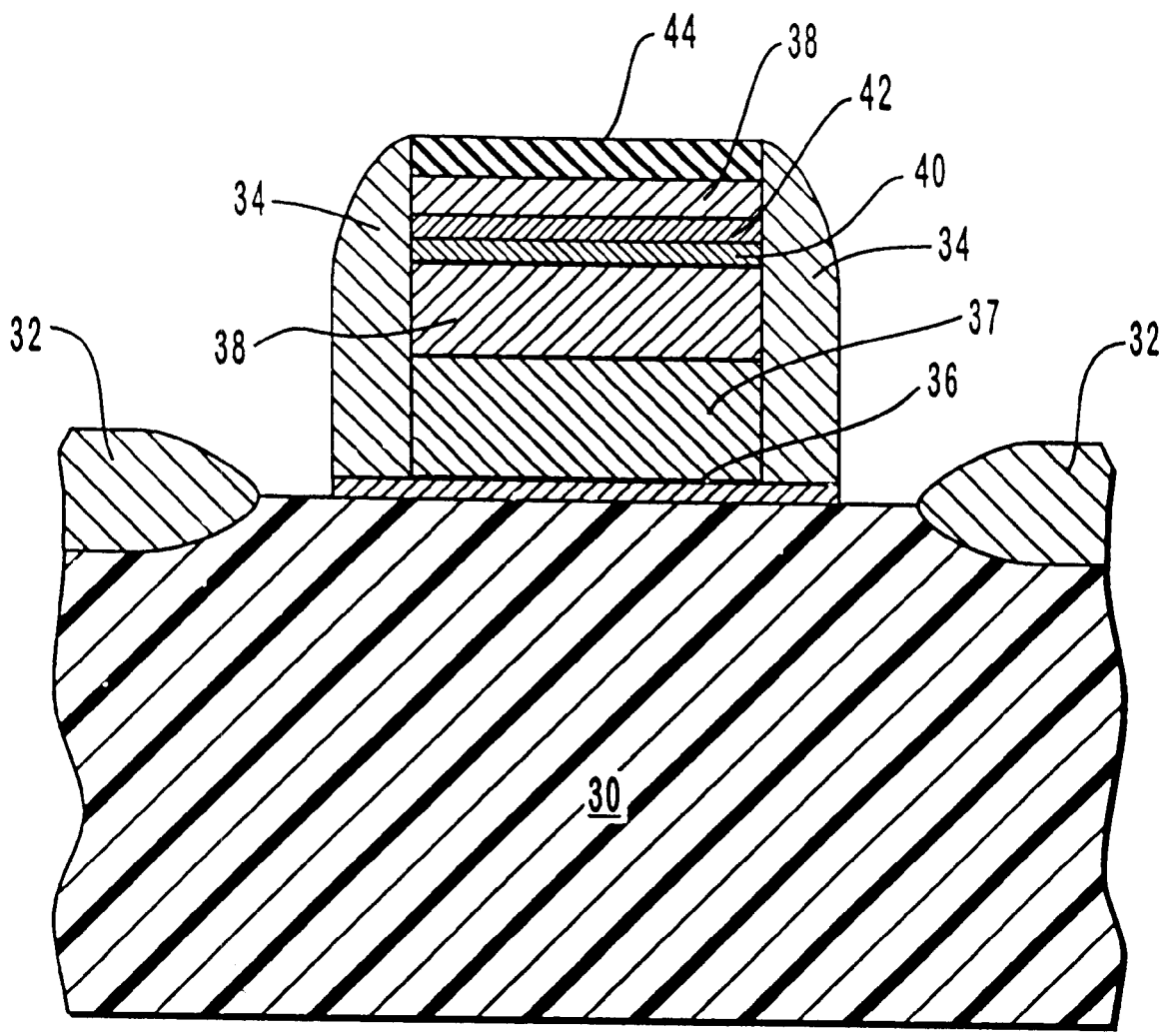
FIG. 6 is cross-sectional depiction of a semiconductor structure having a gate stack isolated by field oxide regions a silicon substrate, the gate stack having an electrical insulator layer on the silicon substrate, a gate layer deposited over the electrical insulator layer, a metal silicide layer deposited over the gate layer, an electrically insulating cap deposited over the metal silicide, and an electrically insulting spacer layer surrounding said gate layer and the metal silicide layer, the metal silicide layer having a first implant matrix subadjacent to a second implant matrix, the first and second implant matrices having a plurality of ion dopants stuffed in between the grains of the metal silicide layer. Typically only one implantation is needed, however multiple implantations can be done for specialized materials needs.

An example of a semiconductor structure incorporating GBS is seen in FIG. 6 where a gate stack is isolated by field oxide regions 32 on a substrate 30. The gate stack has an electrical insulator layer 36 on substrate 30, a gate layer 37 deposited over electrical insulator layer 36, a metal silicide layer 38 deposited over gate layer 37, subadjacent to an insulation layer 44, and a electrically insulating spacer layer 34 surrounding gate layer 37 and metal silicide layer 38. Metal silicide layer has a first implant matrix 40 subadjacent to a second implant matrix 42, first and second implant matrices 40, 42 having a plurality of ion dopants stuffed in between the grains of metal silicide layer 38.

In a typical RTP cycle, anneals of 1000° C., for a period of 20 seconds, and in a nitrogen atmosphere are carried out three times. Without the practice of the GBS technique of the present invention, large grain size films are prone to such cracking under the RTP conditions.

As an example of an application of the invention to a specific structure in the semiconductor art, $TiSi_{2.2}$ is sputtered onto an $SiO_2$ substrate as a gate electrode in advanced DRAM word line metallization. After three RTP cycles, the film stress and warpage in the $TiSi_{2.2}$ increases from less than 20 microns (a currently acceptable amount) to more than 40 microns. The warpage is due to the highly-oriented $TiSi_{2.2}$ grains collapsing to form very large grains with highly oriented, high-density packing planes. The occurrence of Si with the Ti as-sputtered is from about 2.0 Si to about 3.0 Si. A more preferred occurrence is from about 2.1 to about 2.6, and the most preferred is $TiSi_{2.2}$.

Grain boundary stuffing technology is carried out before the RTP cycles to maintain the small-grain morphology present in the $TiSi_{2.2}$ as-sputtered. In DRAM gate electrode formation, the $TiSi_{2.2}$ layer can be from 150 to 5000 Å thick. If the thin film is 1000 Å thick, then GBS will be done at about 500 Å, and not directly at the thin film-substrate interface. Implantation elements such as W, Mo, Co, P, and N are used. A preferred implantation is P at an energy of 20 KeV and $2\times10^{13}$ $cm^{-2}$, but equivalent stop ranges can be accomplished with the other preferred implantation elements by adjusting the implantation energies according to the implantation element masses.

EXAMPLE

A 1500 Å thick layer of $TiSi_{2.2}$ is sputtered onto an $SiO_2$ substrate at 300° C. The composite is then subjected to grain boundary stuffing by use of an ion implantation device using an energy of about 20 KeV that accomplishes a phosphorus matrix structure of $2\times10^{13}/cm^{-2}$. Following GBS, the composite is subjected to three RTP cycles of 1000° C., for period of about 20 seconds, and in an $N_2$ atmosphere. Sheet resistance expressed in Rs (ohms/sq) for the thin film before and after each RTP anneal was measured at 13.018 before the first anneal and at 1.046, 1.072, and 1.125 after each anneal respectively. The Rs remains virtually constant and the integrity of the film is retained due to the GBS treatment. The warpage is measured at 25.33 microns. A warpage near 20 microns is considered to be an acceptable warpage.

COMPARATIVE EXAMPLE

In this example all conditions of the first example are repeated except the GBS step is omitted. The warpage is measured at 38.71 microns. A warpage near 40 microns is considered to be outside acceptable warpage parameters.

As described herein, the present invention taking advantage of the grain growth characteristics of titanium silicides. The diffusion boundary characteristics of polysilicon produces a significantly lower sheet resistivity of titanium disilicide with improved thermal stability, and significantly reduces the tendency of annealed titanium disilicide films to warp silicon wafers during semiconductor processing.

The present invention may be embodied in other specific forms without departing from its spirit or essential characteristics. The described embodiments are to be considered in all respects only as illustrated and not restrictive. The scope of the invention is, therefore, indicated by the appended claim's rather than by the foregoing description. All changes which come within the meaning and range of equivalency of the claims are to be embraced within their scope.

What is claimed and desired to be secured by United States Letters Patent is:

1. A film formation method comprising
   forming an implant layer on a substrate, said implant layer having a plurality of grains therein;
   bombarding said implant layer, through an exposed surface thereon, with a source of ions to implant said implant layer with said ions at a first depth;
   rapid thermal processing said implant layer at a temperature and for a time sufficient to increase the grain size of the grains in said plurality of grains in said implant layer; and
   bombarding the exposed surface of said implant layer with said source of ions to implant said implant layer with said ions, said ions being implanted at a second depth.

2. The method of claim 1, wherein the second depth is greater than and separated from the first depth.

3. The method of claim 1, wherein said ions of said ion source are selected from the group consisting of nitrogen, phosphorus, molybdenum, tungsten, cobalt, and combinations thereof.

4. The method of claim 1, wherein said implant layer is selected from the group consisting of refractory metal silicides, alumina, zirconia, ceria, silica, $Si_3N_4$, and metal nitrides and combinations thereof.

5. The method of claim 1, wherein said substrate is selected from the group consisting of $SiO_2$, monocrystalline silicon, polysilicon, and a-Si.

6. The method of claim 1, wherein said rapid thermal processing comprises multiple rapid thermal processing heat cycles, and/or furnace anneals.

7. The method of claim 6, wherein said multiple heat cycles are conducted in an atmosphere having at least one inert gas.

8. The method of claim 1, wherein said implant layer comprises $TiSi_x$, where $x \geq 2$.

9. The method of claim 8, wherein said $TiSi_x$ is sputtered on said substrate, and said substrate is composed of a material selected from the group consisting of $SiO_2$ and polysilicon.

10. The method of claim 9, wherein said layer of $TiSi_x$ has a thickness of about 150 Å to about 5000 Å.

11. The method of claim 1, wherein the implant layer has a thickness of about 150 Å to about 5000 Å and a sheet resistance greater than 1.046 ohm/sq.

12. A method for fabricating a semiconductor device, comprising
   forming a gate stack isolated by field oxide regions in a substrate, said gate stack having an electrical insulator layer on said substrate, a gate layer deposited on said electrical insulator layer, an implant layer deposited on said gate layer, and an electrically insulating spacer layer surrounding said gate layer and said implant layer, said implant layer being composed of a material having a plurality of grains;
   bombarding said implant layer, through an exposed surface thereon, with a source of ions to implant said implant layer with said ions at a first depth;
   rapid thermal processing said implant layer to increase the grain size of the grains in said plurality of grains in said implant layer; and
   bombarding said implant layer through said exposed surface with said source of ions to implant said implant layer with said ions, said ions being implanted at a second depth.

13. The method of claim 12, wherein the second depth is greater than and separated from the first depth.

14. The method of claim 12, wherein said ions of said ion source are selected from the group consisting of nitrogen, phosphorus, tungsten, cobalt, and combinations thereof.

15. The method of claim 12, wherein said implant layer is selected from the group consisting of refractory metal silicides, alumina, zirconia, ceria, silica, $Si_3N_4$, and metal nitrides and combinations thereof.

16. The method of claim 12, wherein said substrate is selected from the group consisting of $SiO_2$, monocrystalline silicon, polysilicon, and a-Si.

17. The method of claim 12, wherein said rapid thermal processing comprises multiple heat cycles and/or furnace anneals.

18. The method of claim 17, wherein said multiple heat cycles are conducted in an atmosphere having at least one inert gas.

19. The method of claim 12, wherein said implant layer comprises $TiSi_x$ where $x \geq 2$.

20. The method of claim 19, wherein said $TiSi_x$ is sputtered on said substrate, and said substrate is composed of a material selected from the group consisting of $SiO_2$ and polysilicon.

21. The method of claim 20, wherein said layer of $TiSi_x$ has a thickness of about 150 Å to about 5000 Å.

22. The method of claim 12, wherein the implant layer has a thickness of about 150 Å to about 5000 Å and a sheet resistance greater than 1.046 ohm/sq.

23. The method of claim 12, further wherein said implant layer comprises $TiSi_x$, x is in a range of about 2.0 to about 3.0, and the implant layer has a thickness in a range of about 200 Angstroms to about 3500 Angstroms.

24. The method of claim 12, wherein the electrical insulator layer on said substrate comprises $SiO_2$, the gate layer comprises polysilicon, the implant layer comprises $TiSi_x$, and the electrically insulting spacer layer surrounding said gate layer and said implant layer is selected from a group consisting of refractory metal silicides, alumina, zirconia, ceria silica, $Si_3N_4$, and metal nitrides and combinations thereof.

25. The method of claim 12, wherein the implant layer is formed by:
   depositing a refractory metal upon said gate layer, said gate layer comprising polysilicon;
   heating the substrate to react the deposited refractory metal with the gate layer of polysilicon to form a refractory metal silicide; and
   removing said deposited refractory metal that is unreacted with said polysilicon of said gate layer.

26. A film formation method comprising:
   forming an implant layer on a substrate, said implant having a plurality of grains therein, wherein said implant layer comprises $TiSi_x$ where $x \geq 2$, wherein said $TiSi_x$ is sputtered on said substrate and said substrate is composed of a material selected from the group consisting of $SiO_2$ and polysilicon, and wherein said layer of $TiSi_x$ has a thickness of about 150 Å to about 5000 Å;

bombarding said implant layer, through an exposed surface thereon, with a source of phosphorous ions to implant said implant layer with said phosphorous ions at a first depth;

bombarding said implant layer, through said exposed surface thereon, with said source of phosphorous ions to implant said implant layer with said phosphorous ions at a second depth greater than the first depth; and heating said implant layer to increase the grain size of the grains in said plurality of grains in said implant layer.

27. A method for fabricating a semiconductor device comprising:

forming a gate stack isolated by field oxide regions in a substrate, said gate stack having an electrical insulator layer on said substrate, a gate layer disposed on said electrical insulator layer, an implant layer disposed on said gate layer, and an electrically insulating spacer layer surrounding said gate layer and said implant layer, said implant layer having a thickness of about 150 Å to about 5000 Å and being composed of $TiSi_x$, where $x \geq 2$, said $TiSi_x$ having a plurality of grains therein, wherein said $TiSi_x$ is sputtered on said substrate, said substrate being composed of a material selected from the group consisting of $SiO_2$ and polysilicon;

bombarding said implant layer, through an exposed surface thereon, with a source of phosphorous ions to implant said implant layer with said phosphorous ions at a first depth;

bombarding said implant layer, through said exposed surface thereon, with said source of phosphorous ions to implant said implant layer with said phosphorous ions at a second depth greater than the first depth; and heating said implant layer with a plurality of rapid thermal processing anneals to increase the grain size of the grains in said plurality of grains in said implant layer.

28. A method for fabricating a semiconductor device, comprising forming an electrically conductive material situated upon a substrate;

forming an implant layer, composed of a material having a plurality of grains therein, on said electrically conductive material;

bombarding said implant layer, through an exposed surface thereon, with a source of ions to implant said implant layer with said ions at a first depth;

bombarding said implant layer, through said exposed surface thereon, with said source of ions to implant said implant layer with said ions at a second depth greater than and separated from the first depth;

forming an electrically insulting layer on said electrically conductive material and said implant layer; and rapid thermal processing said implant layer to increase the grain size of the grains in said plurality of grains in said implant layer.

29. A semiconductor fabrication method comprising:

forming a pair of field oxides in a silicon substrate;

forming a gate oxide on the silicon substrate;

forming an electrically conductive gate layer on the gate oxide;

forming a refractory metal silicide layer having a plurality of grain therein and situated on the electrically conductive gate layer;

bombarding said refractory metal silicide layer, through an exposed surface thereon, with a source of ions to implant said refractory metal silicide layer with said ions at a first depth;

bombarding said refractory metal silicide layer, through said exposed surface thereon, with a source of ions to implant said refractory metal silicide layer with said ions at a second depth that is greater than and separated from the first depth;

rapid thermal processing said refractory metal silicide layer to increase the grain size of the grains in said plurality of grains in said refractory metal silicide layer;

forming an electrically insulative layer on the refractory metal silicide layer;

forming a gate stack from the gate oxide, the gate layer, the refractory metal silicide layer, and the electrically insulative layer, the gate stack having a sidewall and being situated in between that pair of field oxides; and forming an electrically insulative spacer on the sidewall of the gate stack.

30. The method as defined in claim 29, wherein:

the refractory metal silicide layer is composed of titanium silicide.

* * * * *

UNITED STATES PATENT AND TRADEMARK OFFICE
CERTIFICATE OF CORRECTION

PATENT NO. : 6,204,173 B1
DATED : March 20, 2001
INVENTOR(S) : Yong-Jun Hu; Pai Hung Pan Page 1 of 2

It is certified that error appears in the above-identified patent and that said Letters Patent is hereby corrected as shown below:

Title page,
Item [57] ABSTRACT,
Line 4, after "stresses" delete [in]

Column 2,
Line 28, after "C." insert comma
Line 64, before "the grain structure" insert a comma after "TiSi$_2$"

Column 3,
Line 21, change "effect" to -- effects --

Column 4,
Line 37, after "regions" insert a comma
Lines 42-43, change "insulting" to -- insulating --

Column 5,
Line 5, after "other" delete [is]

Column 6,
Line 46, after "for" insert -- a --

Column 7,
Line 46, change "illustrated" to -- illustrate --
Lines 11 and 56, after "comprising" insert a colon Column 9,
Line 39, after "comprising" insert a colon

UNITED STATES PATENT AND TRADEMARK OFFICE
CERTIFICATE OF CORRECTION

PATENT NO.    : 6,204,173 B1
DATED         : March 20, 2001
INVENTOR(S)   : Yong-Jun Hu; Pai Hung Pan It is certified that error appears in the above-identified patent and that said Letters Patent is hereby corrected as shown below:

Column 10,
Line 5, change "insulting" to -- insulating --

Signed and Sealed this

Fifth Day of March, 2002

JAMES E. ROGAN
*Director of the United States Patent and Trademark Office*

*Attest:*

*Attesting Officer*